United States Patent
Dhong et al.

[19]

[11] Patent Number: 6,166,437
[45] Date of Patent: Dec. 26, 2000

[54] SILICON ON SILICON PACKAGE WITH PRECISION ALIGN MACRO

[75] Inventors: Sang Hoo Dhong, Austin; Kevin John Nowka, Round Rock; Michael Jay Shapiro, Austin, all of Tex.

[73] Assignee: International Business Machines Corporation, Armonk, N.Y.

[21] Appl. No.: 09/290,921

[22] Filed: Apr. 12, 1999

[51] Int. Cl.⁷ ............................ H01L 23/34; H01L 23/48; H01L 23/52

[52] U.S. Cl. .......................... 257/723; 257/665; 257/779; 257/685

[58] Field of Search .................................. 257/723, 678, 257/665, 779, 685

[56] References Cited

U.S. PATENT DOCUMENTS

| | | | |
|---|---|---|---|
| 5,814,885 | 9/1998 | Pogge et al. | 257/730 |
| 6,020,624 | 2/2000 | Wodd et al. | 257/618 |
| 6,042,391 | 3/2000 | Bodo et al. | 439/74 |

*Primary Examiner*—David Hardy
*Assistant Examiner*—Jhihan B Clark

*Attorney, Agent, or Firm*—Casimer K. Salys; Felsman, Bradley, Vaden, Gunter & Dillon, LLP

[57] ABSTRACT

A silicon wafer is etched to form a first and second series of guidance features. The features of the first series are larger than and surround the features of the second series. The second series is clustered into groups and a hole is formed in the center of each group. The wafer is designed to integrate a silicon package having preformed contacts with a plurality of silicon-based chips. The package and each chip has a series of guidance recesses which correspond to the guidance features of the first and second series, respectively. One chip is placed on top of each group of the second series, and the package is placed on top of the first series. The recesses in the package and chips will precisely align with and slidingly engage the upper ends of the features. Since the features of the first series are larger than those of the second series, there is a clearance between the package and the chips. In the final stage of assembly, the package is restrained from movement and a pin is inserted through each hole in the wafer to force the chips into contact with the contacts on the package. Heat is then applied to fuse solder balls on the chips with the contacts to form a complete and finished assembly.

4 Claims, 4 Drawing Sheets

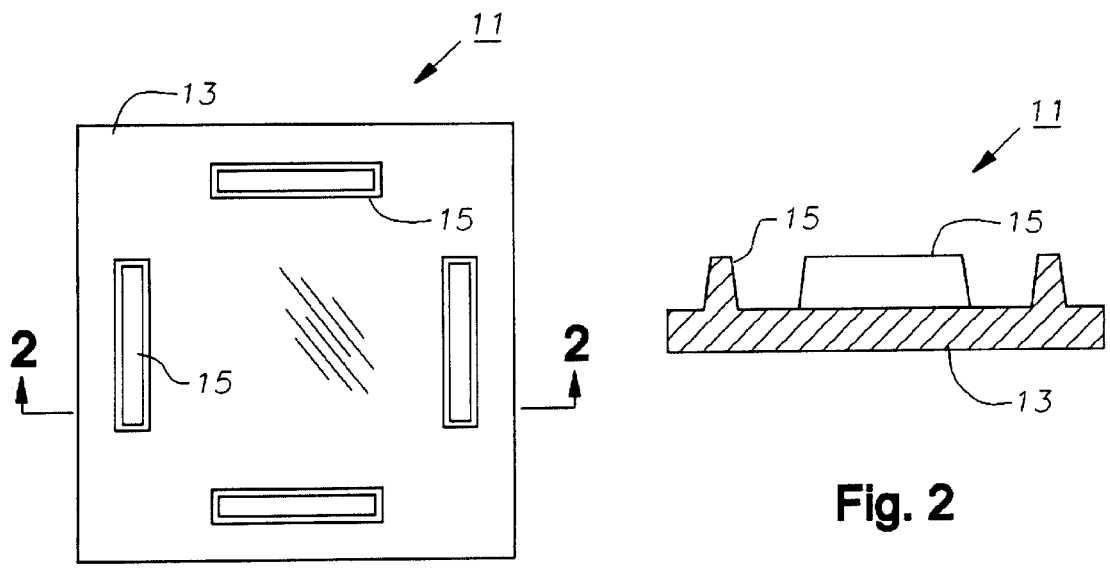
Fig. 1
Fig. 2
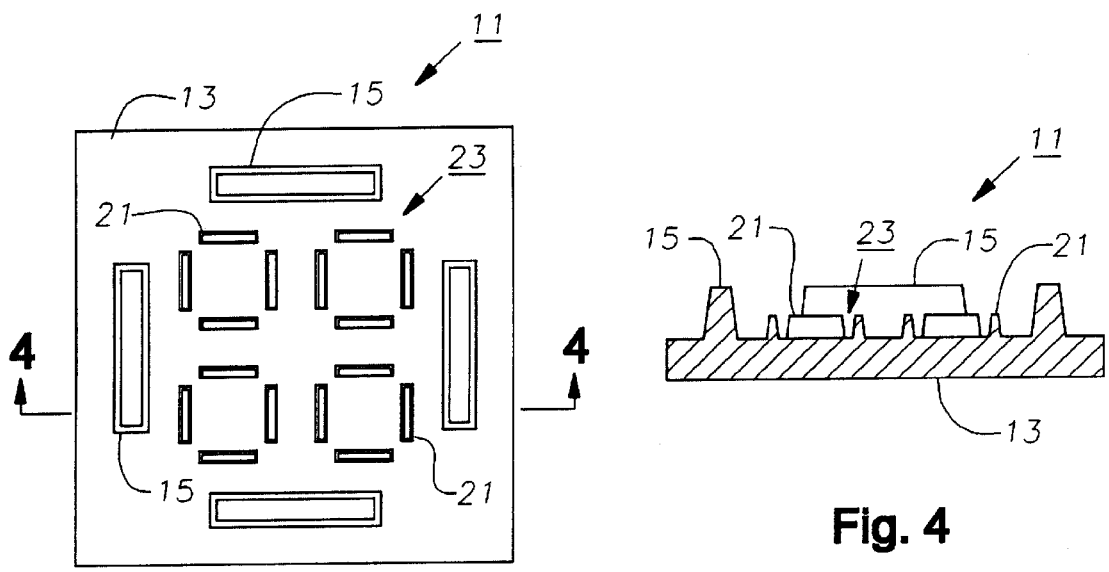
Fig. 3
Fig. 4

SILICON ON SILICON PACKAGE WITH PRECISION ALIGN MACRO

BACKGROUND OF THE INVENTION

1. Technical Field

This invention relates in general to semiconductor packages and in particular to the integration of multiple, finished semiconductor components into a high density, single chip format.

2. Background Art

As described in U.S. Pat. No. 5,814,885, which is incorporated herein by reference, a precision alignment macro process is used to bond individual semiconductor chips or components together with an unfinished semiconductor package to form a single, larger, higher density integrated chip. The advantage of this process is that multiple chips can be placed very close together (within 50 microns of one another) so that the interconnect wiring distances are minimized. As discussed in the patent, the wiring or electrical connections between the components are made after they are joined together. Although this design is workable, it would be beneficial to eliminate the additional processing steps required to perform the interconnection between the components after they are joined.

SUMMARY OF THE INVENTION

A silicon carrier wafer is etched to form a first and second series of tapered guidance features. The features of the first series are larger than and surround the features of the second series. The second series of features are clustered into groups and a hole is formed in the center of each group. The wafer is designed to integrate a silicon package having preformed contacts with a plurality of silicon-based chips. The package and each chip has a series of guidance recesses which correspond to the guidance features of the first and second series, respectively.

One chip is placed on top of each group of the second series of features, and the package is placed on top of the first series of features. The recesses in the package and chips will precisely align with and slidingly engage the upper ends of the features. Since the features of the first series are larger than those of the second series, there is a clearance between the package and the chips. In the final stage of assembly, the package is restrained from movement and a pin is inserted through each hole in the wafer to force the chips into contact with the contacts on the package. Heat is then applied to fuse solder balls on the chips with the contacts to form a complete and finished assembly.

BRIEF DESCRIPTION OF THE DRAWINGS

FIG. 1 is a top view of a carrier wafer at an initial stage of processing and is constructed in accordance with the invention.

FIG. 2 is a sectional side view of the carrier wafer of FIG. 1 taken along the line 2—2.

FIG. 3 is a top view of the carrier wafer of FIGS. 1 and 2 at a second stage of processing.

FIG. 4 is a sectional side view of the carrier wafer of FIG. 3 taken along the line 4—4.

BEST MODE FOR CARRYING OUT THE INVENTION

Figure 5:
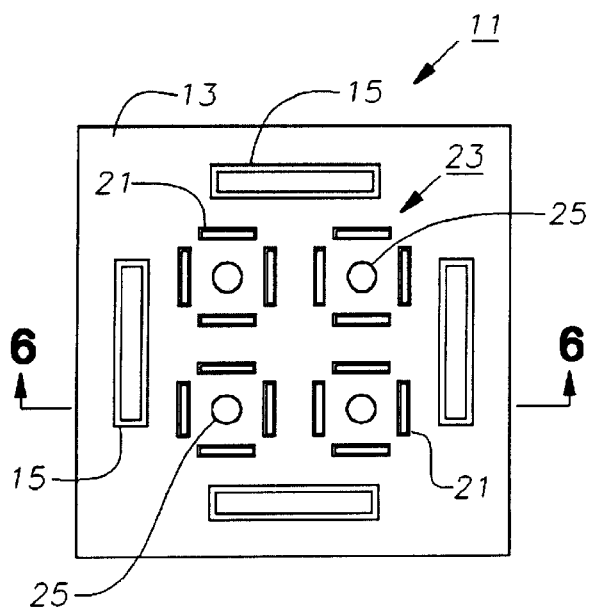
FIG. 5 is a top view of the carrier wafer of FIGS. 1–4 at a third stage of processing.

Referring to FIGS. 1 and 2, a schematic drawing of a silicon carrier wafer 11 is shown. Wafer 11 has a base or substrate 13 that has been patterned and wet etched in a conventional manner to form a first series of guidance features 15. For ease of understanding, guidance features 15 are depicted as four thin, generally rectangular blocks which protrude from one surface of substrate 13. However, they may comprise many different forms, shapes and configurations. In the embodiment shown, each guidance feature 15 is located near a lateral edge of substrate 13, such that they are spaced apart from one another in an orthogonal and symmetric formation. Note that since guidance features 15 are integrally formed from the silicon substrate 13, they are naturally tapered during the etching process.

As shown in FIGS. 3 and 4, wafer 11 is subjected to a second etching process to form a second series of guidance features 21. In the embodiment shown, guidance features 21 are clustered into four groups 23 of four guidance features 21. All four groups 23 are located between the four larger guidance features 15, and are symmetrically and orthogonally spaced apart from each other. Guidance features 21 are also tapered due to their silicon consistency. The second etching process causes guidance features 15 to grow somewhat, such that they are larger than guidance features 21.

Figure 6:
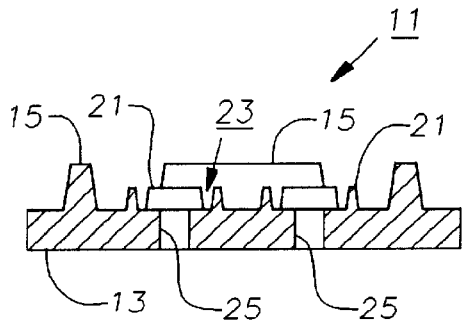
FIG. 6 is a sectional side view of the carrier wafer of FIG. 5 taken along the line 6—6 of FIG. 5.

Referring now to FIGS. 5 and 6, a third processing step is performed on wafer 11. In this step, a small hole 25 is cut in the center of each group 23 of guidance features 21. Holes 25 may be cut with a high speed diamond drill bit or other cutting device. Holes 25 also could be etched into substrate 13 during one or both of the previous process steps, in which case they would be tapered like guidance features 15, 21. The shape of holes 25 is not critical.

Figure 7:
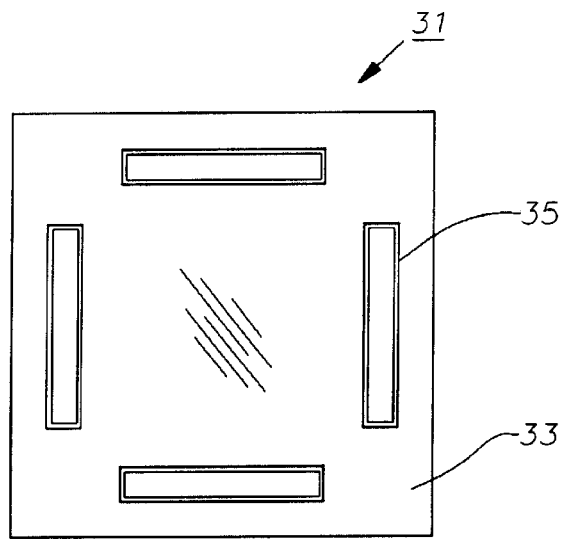
FIG. 7 is a bottom view of a small semiconductor chip.
Figure 8:
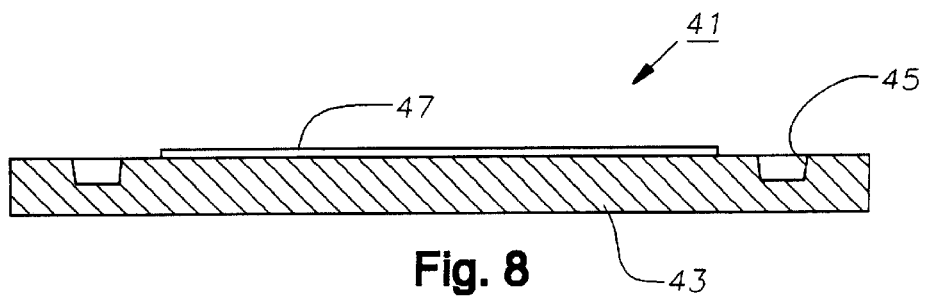
FIG. 8 is a sectional side view of a large silicon package.

Wafer 11 is designed to integrate a plurality of relatively small, silicon-based, integrated circuit chips 31 (FIG. 7). Each chip 31 is formed with conventional semiconductor processing. Each chip 31 comprises a substrate 33 and a series of guidance marks or recesses 35 which may be etched as described above. Recesses 35 correspond to the guidance features 21 in one group 23 on wafer 11. In the embodiment shown, chip 31 has four rectangular recesses 35 which are orthogonal to one another and located near its lateral edges. Wafer 11 also utilizes a relatively large silicon package 41 (FIG. 8) which is much larger than chips 31. Package 41 comprises a substrate 43 with etched recesses 45. Package 41 also has contacts 47 or other wiring features for electrical connectivity. In the embodiment shown, contacts 47 comprise a multi-level wiring pattern. For external interconnection purposes, contacts 47 also have electrical pads around their perimeter edges for wire bonding attachment. Alternatively, substrate 43 may contain electrical vias or holes which are filled with a conductor to provide electrical access to contacts 47 from the backside of package 41.

Figure 9:
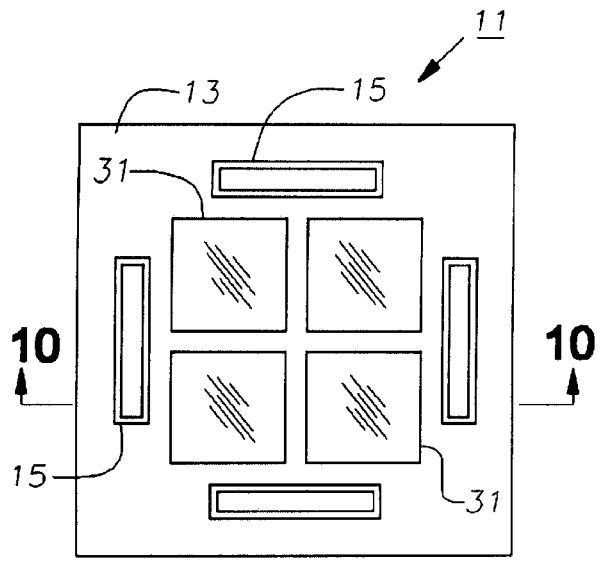
FIG. 9 is a top view of four of the chips of FIG. 7 mounted to the carrier wafer of FIGS. 5 and 6.
Figure 10:
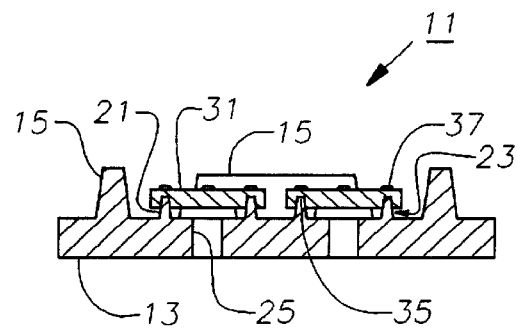
FIG. 10 is a sectional side view of the chips and carrier wafer of FIG. 9 taken along the line 10—10 of FIG. 9.

Referring now to FIGS. 9 and 10, one chip 31 is placed on top of each group 23 of guidance features 21. Chips 31 may be picked and placed with conventional vacuum placement devices. The recesses 35 in chips 31 will precisely align with and slidingly engage the upper ends of guidance features 21. In the embodiment shown, each of the four chips 31 is supported by four guidance features 21. Chips 31 do not contact guidance features 15. Note that in this view, conventional solder balls 37 are visible on the top surface of each chip 31.

Figure 11:
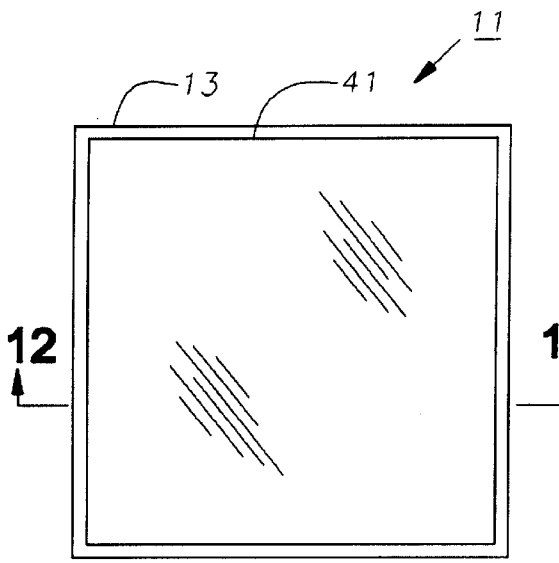
FIG. 11 is a top view of the silicon package of FIG. 8 mounted to the subassembly of FIGS. 9 and 10.
Figure 12:
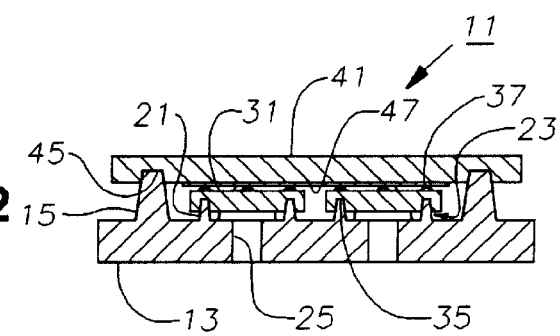
FIG. 12 is a sectional side view of the assembly of FIG. 11 taken along the line 12—12 of FIG. 11.

In the next assembly step (FIGS. 11 and 12), silicon package 41 is placed on top of wafer 11. The recesses 45 in package 41 precisely align with and slidingly engage the upper ends of guidance features 15. Since guidance features 15 are longer than guidance features 21, there is a very small clearance or separation between package 41 and chips 31. Thus, at this stage, the contacts 47 on package 41 to not touch the solder balls 37 on chips 31.

Figure 13:
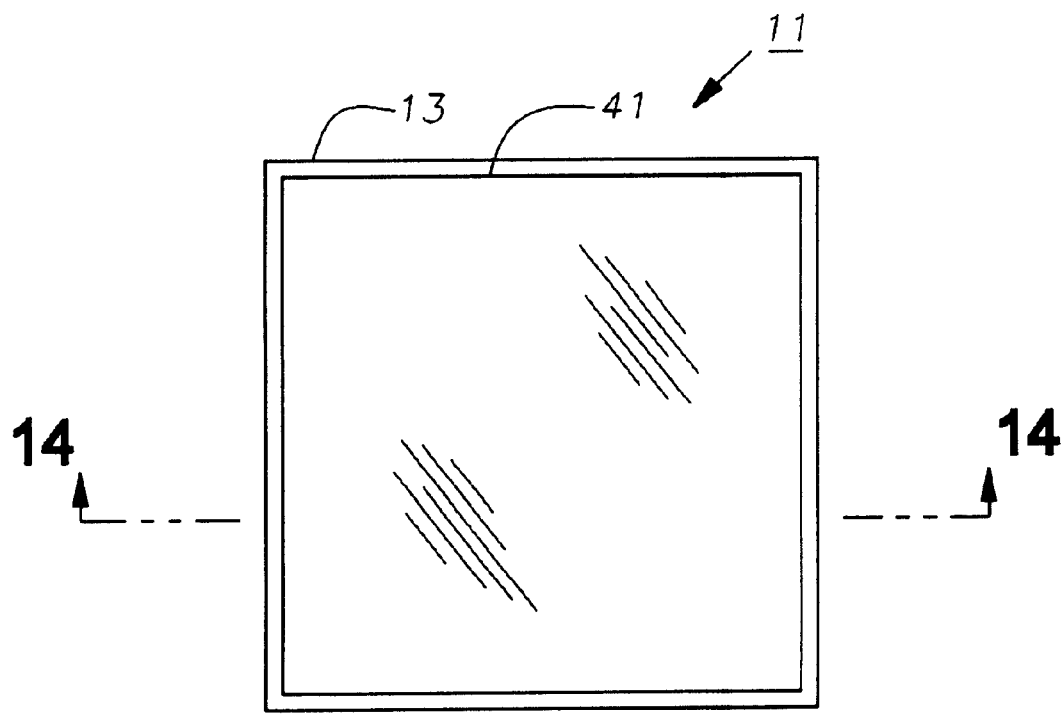
FIG. 13 is a top view of the assembly of FIGS. 11 and 12 after final processing.
Figure 14:
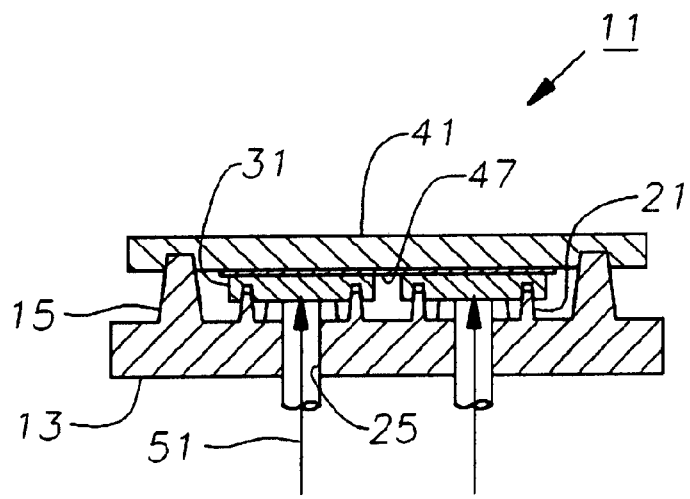
FIG. 14 is a sectional side view of the assembly of FIG. 13 taken along the line 14—14 of FIG. 13.

In the final stage of assembly (FIGS. 13 and 14), the upper surface of package 41 is restrained from movement relative to wafer 11, and a pin 51 is inserted through each hole 25 in wafer 11. With package 41 restrained, chips 31 are forced upward into contact with package 41, such that the solder balls 37 on chips 31 engage contacts 47 on package 41. Conventional heat is simultaneously applied so that the solder balls 37 melt and precisely fuse with contacts 47. After cooling, a complete assembly comprising only interconnected package 41 and chips 31 is formed and removed from wafer 11. In necessary, the package 41/chips 31 assembly may be subsequently sealed. During installation of the assembly, external interconnection is made by wirebonding to the pads at the perimeter of contacts 47 or, alternatively, through electrical vias in substrate 43 (not shown).

The invention has several advantages. The described process uses a precision lithographic alignment macro technique with a silicon on silicon package to position and align chips on the package. The features allow the chips to be placed close together and to be precisely placed on the package, thereby allowing the density of a module or wafer to be significantly increased. This technology solves the problem of putting many devices or macros on a single silicon chip which would be quite large and difficult to manufacture. Concerns regarding differing thermal coefficients of expansion are eliminated since all the components are formed from silicon. The invention also has the advantage that if one or more chips do not function properly, they can be replaced. This is simply achieved by removing the failing chip and using the precision alignment macro carrier to align the new chip with the silicon package. Chips may be added or removed one at a time.

While the invention has been shown or described in only some of its forms, it should be apparent to those skilled in the art that it is not so limited, but is susceptible to various changes without departing from the scope of the invention.

We claim:

1. An integrated circuit module, comprising:

a silicon carrier wafer;

a first guidance feature on the wafer;

a second guidance feature on the wafer having a plurality of groups;

a silicon package having a first electrical interconnect element and a first guidance element which is complementary to the first guidance feature, such that the silicon package is mounted to the first guidance feature;

a plurality of silicon integrated circuit chips, each having a second electrical interconnect element and a second guidance element which is complementary to each of the groups of the second guidance feature, such that each of the chips is mounted to one of the groups of the second guidance feature, and the chips are located between the wafer and the package; and wherein when the electrical interconnect element of the chips are moved into contact and fused with those of the package an assembly is formed, such that the package and the chips are electrically interconnected to one another upon being fused.

2. The module of claim 1 wherein the assembly is detachable from the wafer.

3. The module of claim 1 wherein the package or any of the chips may be removed from the assembly and replaced by an equivalent substitute.

4. The module of claim 1, further comprising a hole in the wafer adjacent to each group of the second guidance feature, wherein the holes provide access to the chips for moving the chips relative to the package.

* * * * *